(12) United States Patent
van Oort

(10) Patent No.: US 6,456,077 B2
(45) Date of Patent: Sep. 24, 2002

(54) METHOD FOR GENERATING FERROMAGNETIC SHIM CALIBRATION FILE

(75) Inventor: Johannes Martinus van Oort, Niskayuna, NY (US)

(73) Assignee: General Electric Company, Schenectady, NY (US)

( * ) Notice: Subject to any disclaimer, the term of this patent is extended or adjusted under 35 U.S.C. 154(b) by 22 days.

(21) Appl. No.: 09/795,166

(22) Filed: Feb. 28, 2001

Related U.S. Application Data

(60) Provisional application No. 60/185,793, filed on Feb. 29, 2000.

(51) Int. Cl.[7] .................................................. G01V 3/00
(52) U.S. Cl. ........................................ 324/320; 324/319
(58) Field of Search ............................... 324/320, 319, 324/318, 321, 322, 300, 306, 307, 309; 335/214, 216, 296, 299, 301, 304

(56) References Cited

U.S. PATENT DOCUMENTS

| | | | |
|---|---|---|---|
| 5,045,794 A | 9/1991 | Dorri et al. ................. | 324/320 |
| 5,532,597 A * | 7/1996 | McGinley et al. ........... | 324/319 |
| 6,181,137 B1 * | 1/2001 | Havens et al. .............. | 324/319 |

* cited by examiner

Primary Examiner—Louis Arana
(74) Attorney, Agent, or Firm—Jill M. Breedlove; Christian G. Cabou

(57) ABSTRACT

A method for generating a ferromagnetic shim calibration file includes the steps of performing a computation of an analytical Finite Element solution of an internal magnetic field for each location where a shim is assumed to be present in an imaging volume of a magnet, performing a computation of an equivalent magnetic dipole moment of a shim with a saturated magnetization using the analytical Finite Element solution of the internal magnetic field, making a correction of the computation of the equivalent magnetic dipole moment of the shim to compensate for an aspect ratio for the shape of the shim, making another correction of the corrected computation of the equivalent magnetic dipole moment of the shim to compensate for a magnetic mirror effect in a pole-face of the magnet, and storing all computations and corrections for each shim in a shim calibration file.

14 Claims, 2 Drawing Sheets

METHOD FOR GENERATING FERROMAGNETIC SHIM CALIBRATION FILE

CROSS REFERENCE TO RELATED APPLICATIONS

This application claims the benefit of U.S. provisional application No. 60/185,793 filed on Feb. 29, 2000.

BACKGROUND OF THE INVENTION

The present invention generally relates to shimming magnetic resonance imaging (MRI) magnets and, more particularly, is concerned with a method for generating a ferromagnetic shim calibration file for use in shimming all MRI magnets.

Prior art methods exist that compute the magnetic field generated by a shim, a piece of ferromagnetic material, placed in a magnetic field. These methods assume that the external applied magnetic field is of sufficient strength to saturate the shim material. In these method, the solution of the magnetic field as a function of the weight of the shim is reduced to a straightforward calculation of the dipole moment of the shim in saturation. Thus, current shim calculation methods assumes that the shim material is in saturation.

More particularly, these methods compute the magnetic field for each shim at a certain location under the assumption that the shim is saturated (i.e. all magnetic domains in the shim material are aligned with the driving magnetic field). It also only takes into account the influence of the field generated by the shim in one direction (along the shim length). This method works satisfactory for cylindrical MRI systems, where the shim system is not influenced by nearby large masses of iron, such as the pole-face. It does not produce accurate accounts where such polefaces are present and the shims are located near such a pole-face.

In a magnet containing an iron or permanent-magnet pole-face, the shims are not necessarily saturated. To compute the influence of the magnetic field generated by a shim placed on or close to such a pole-face, a finite element analysis (FEA) solution is generally used. This is both time-consuming and inaccurate since a full three-dimensional solution is needed and the size of the shim is very small compared to the size of the magnet which causes difficulties in building a mesh for the finite-element code.

Thus, prior art methods assume saturation of the shims, and use an analytical approach to compute a shim calibration strength that is independent of shim shape. These methods are not useful in open geometry MRI magnets. Consequently, a need exists for an innovation which will overcome the problem with prior art methods without introducing new problems.

BRIEF SUMMARY OF THE INVENTION

The present invention provides a ferromagnetic shim calibration file generating method designed to satisfy the aforementioned need. The method of the present invention generates a ferromagnetic shim calibration file which is accurate and useful in shimming all MRI magnets. The method makes use of FEA models to generate the local magnetic field at the shim location. The internal magnetization is used together with a shape factor correction algorithm to produce an accurate external magnetization.

In one embodiment of the present invention, a method for generating a ferromagnetic shim calibration file is provided which comprises the steps of performing a computation of an analytical Finite Element solution of an internal magnetic field for each location where a shim is assumed to be present in an imaging volume of a magnet, performing a computation of an equivalent magnetic dipole moment of a shim with a saturated magnetization using the analytical Finite Element solution of the internal magnetic field, and storing all computations for each shim in a shim calibration file. The method further comprises making a correction of the computation of the equivalent magnetic dipole moment of each shim to compensate for an aspect ratio for the shape of the shim and storing the correction for each shim in the shim calibration file. The method still further comprises making a correction of the computation of the equivalent magnetic dipole moment of each shim to compensate for a magnetic mirror effect in a pole-face of the magnet and storing the correction for each shim in the shim calibration file.

DETAILED DESCRIPTION OF THE INVENTION

Figure 1:
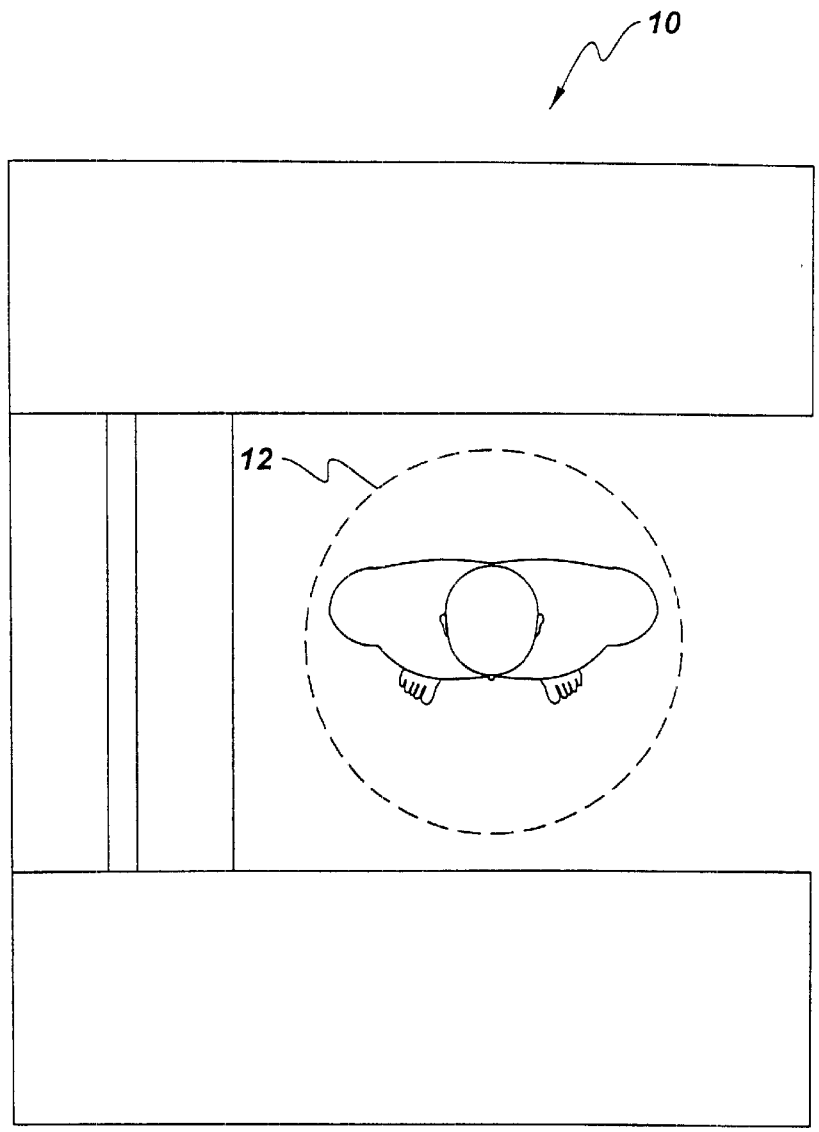
FIG. 1 is a schematic view of an open MRI magnet having an imaging volume to which can be applied computations and corrections stored in a shim calibration file produced by a ferromagnetic shim calibration file generating method of the present invention.

Referring now to the drawings and particularly to FIG. 1, there is illustrated a schematic representation of an open MRI magnet, generally designated 10, which includes a magnetic resonance imaging volume 12 (seen as a dotted line in FIG. 1). The imaging volume 12 is generally spherical in configuration.

Figure 2:
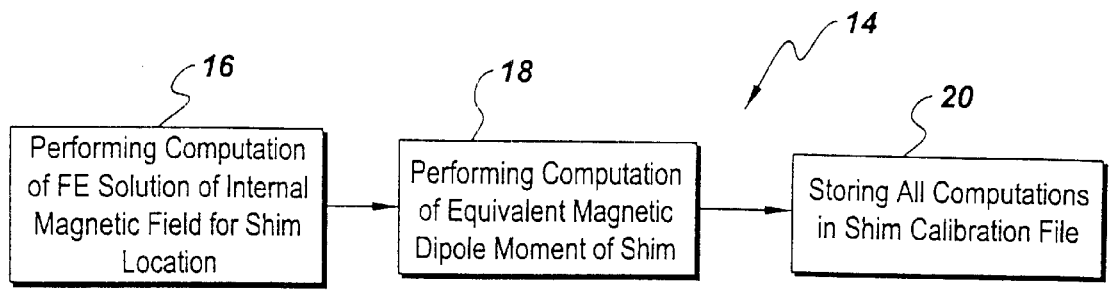
FIG. 2 is a flow diagram of the steps of the generating method by which all computations for each shim are stored in the shim calibration file.

Referring now to FIG. 2, there is illustrated in a flow chart, generally designated 14, the steps of a method of the present invention for generating a ferromagnetic shim calibration file in which all computations for each shim are stored in the shim calibration file for use in shimming the MRI magnet 10 and all other such magnets. Block 16 of the flow chart 14 represents the step of performing a computation of an analytical Finite Element solution of an internal magnetic field for each location where a shim is assumed to be present in the imaging volume 12 of the magnet 10. Block 18 of the flow chart 14 represents the step of performing a computation of an equivalent magnetic dipole moment of a shim with a saturated magnetization using the analytical Finite Element solution of the internal magnetic field. Block 20 of the flow chart 14 represents the step of storing all computations for each shim in a shim calibration file.

Figure 3:
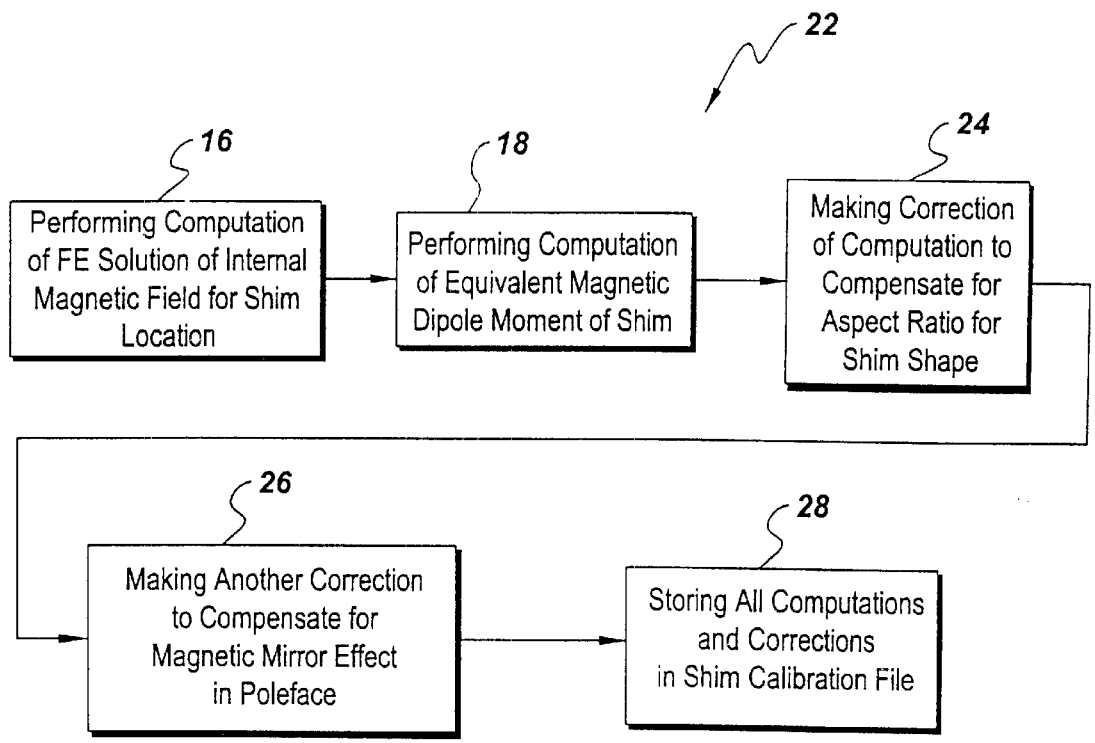
FIG. 3 is a flow diagram of the steps of the generating method by which all computations and corrections for each shim are stored in the shim calibration file.

Referring to FIG. 3, there is illustrated in another flow chart, generally designated 22, the further steps of the method by which all computations and corrections for each shim are stored in the shim calibration file. The method depicted in the flow chart 22 includes the steps of blocks 16 and 18 of the flow chart 14 of FIG. 2. In addition, block 24 of the flow chart 22 represents the further step of making a correction of the computation of the equivalent magnetic dipole moment of each shim to compensate for an aspect ratio for the shape of the shim. Block 26 of the flow chart 22 represents the further step of making another correction of the corrected computation of the equivalent magnetic dipole moment of each shim to compensate for a magnetic mirror effect in a pole-face of the magnet. Block 28 of the flow chart 22 represents the final step of storing the computations and corrections for each shim in the shim calibration file.

The goal of the shim file calibration generation method is the accurate computation of the magnetic field change at N number of locations (X,Y,Z) or (R,phi,Z) within the imaging volume 12 of the MRI magnet 10 as a function of a series of shims with a mass M of a ferromagnetic piece of material placed at location (X',Y',Z') or (R',phi',Z'). A set of equations deltaB=sum F(B,M) over all S shim locations available within the magnet are solved. Each of these placed shims generates a "known" change in the magnetic field in all N locations within the imaging volume. Placing a well-selected series of these shims in certain locations, it is possible to minimize the variation in the magnetic field in the N locations in the imaging volume 12. The eventual purpose is to minimize the field variation to a pre-set series of limits for each field point. The solution method to compute the required mass M and location (X',Y',Z') or (R',phi',Z') of each shim, given a measured (distorted) magnetic field at all N field locations, is a linear programming (LP) algorithm, such as used in U.S. Pat. No. 5,045,794 to Dorri et al and assigned to the assignee of the present invention. For this solution, the inputs into the LP solver are: measured field at a number of locations, requested field at each of these locations, and the magnetic strength of each unit mass of shim at each possible shim location. The IP solver will then return the minimum number of shims to change (and their mass) to achieve the requested goal.

The method of the present invention generates the required calibration (or magnetic strength) information for each shim as a function of location in the magnet. In order to accurately compute the influence on the magnetic field by a shim placed near a pole-face (large mass of ferromagnetic material to be more generic), a finite-element solution of the local field at the shim location has to be used. The reason for this is that the shim is not necessarily saturated, and the direction of magnetization of the shim material is not one-dimensional (like in the cylindrical magnets shim systems). Furthermore, the shims used in some MRI systems are turned 90 degrees (perpendicular) with respect to the flux lines of the main field in most shim locations. This, in general, is not the favorable orientation for a thin piece of magnetizable material in a magnetic field. In essence, it will produce a "self-field" to counteract this external field; its influence on the strength of the shim as seen from far away can be quite large for low aspect ratio shims. Therefore, the shim aspect ratio has to be taken into account in the shim strength computation. Lastly, there is cross-coupling between adjacent shims and between shims and pole-face material. Placing a magnetized piece of material near a magnetizable piece of material will create a "virtual" magnetic mirror within that material which, in turn, enhances the magnetic field change produced. This effect can be up to 45% of the main influence, and thus has to be taken into consideration as well.

Therefore, the method calculates the magnetic field generated by a piece of ferromagnetic material, called a shim, placed in a magnetic field at certain specified points in space. In general, these points in space form a spherical volume termed a DSV. The file that holds the magnetic field at each location in the DSV for each possible location of the shim in the magnet is called the calibration file.

The method uses an analytical solution of the internal magnetic field at the shim location to compute the equivalent magnetic dipole moment of a shim with a fixed (or saturated) magnetization. The method also compensates for the aspect ratio for the shape of the shims, and for magnetic mirror effects in the pole-face of the magnet. The results are sequentially stored in an ASCII file, and saved as the shim calibration file of the magnet, for a given DSV and given average central field.

It is thought that the present invention and its advantages will be understood from the foregoing description and it will be apparent that various changes may be made thereto without departing from the spirit and scope of the invention or sacrificing all of its material advantages, the form hereinbefore described being merely preferred or exemplary embodiment thereof.

What is claimed is:

1. A method for generating a ferromagnetic shim calibration file, comprising the steps of:

performing a computation of an analytical Finite Element solution of an internal magnetic field for each location where a shim is assumed to be present in an imaging volume of a magnet;

performing a computation of an equivalent magnetic dipole moment of a shim with a saturated magnetization using the analytical Finite Element solution of the internal magnetic field; and storing all computations for each shim in a shim calibration file.

2. The method of claim 1 in which said performing the computation of the analytical Finite Element solution includes performing a computation of a two-dimensional axi-symmetric solution of the magnetic field in all locations in the imaging volume of the magnet where a shim is assumed to be present.

3. The method of claim 1 in which said performing the computation of the analytical Finite Element solution includes:

performing a computation of an axi-symmetric solution of the magnetic field in the imaging volume; and interpolating from the axi-symmetric solution the magnetic field at each potential shim location in the imaging volume where a shim of a given size is assumed to be present.

4. The method of claim 1 further comprising:

making a correction of the computation of the equivalent magnetic dipole moment of each shim to compensate for an aspect ratio for the shape of the shim.

5. The method of claim 4 in which said making the correction of the computation of the equivalent magnetic dipole moment of the shim to compensate for an aspect ratio for the shape of the shim includes performing a computation of the internal magnetization of the shim using a BH-curve of the material to determine whether or not the shim is in saturation.

6. The method of claim 4 further comprising:

storing the correction for each shim in the shim calibration file.

7. The method of claim 1 further comprising:

making a correction of the computation of the equivalent magnetic dipole moment of each shim to compensate for a magnetic mirror effect in a pole-face of the magnet.

8. The method of claim 7 in which said making the correction of the computation of the equivalent magnetic dipole moment of the shim to compensate for the magnetic mirror effect in the pole-face of the magnet includes performing a correction for the distance to each field point in the imaging volume as a function of shim mass and location.

9. The method of claim 7 further comprising:

storing the correction for each shim in the shim calibration file.

10. A method for generating a ferromagnetic shim calibration file, comprising the steps of:

performing a computation of an analytical Finite Element solution of an internal magnetic field for each location where a shim is assumed to be present in an imaging volume of a magnet;

performing a computation of an equivalent magnetic dipole moment of a shim with a saturated magnetization using the analytical Finite Element solution of the internal magnetic field;

making a correction of the computation of the equivalent magnetic dipole moment of the shim to compensate for an aspect ratio for the shape of the shim;

making another correction of the corrected computation of the equivalent magnetic dipole moment of the shim to compensate for a magnetic mirror effect in a pole-face of the magnet; and storing all computations and corrections for each shim in a shim calibration file.

11. The method of claim 10 in which said performing the computation of the analytical Finite Element solution includes performing a computation of a two-dimensional axi-symmetric solution of the magnetic field in all locations in the imaging volume of the magnet where a shim is assumed to be present.

12. The method of claim 10 in which said performing the computation of the analytical Finite Element solution includes:

performing a computation of an axi-symmetric solution of the magnetic field in the imaging volume; and interpolating from the axi-symmetric solution the magnetic field at each potential shim location in the imaging volume where a shim of a given size is assumed to be present.

13. The method of claim 10 in which said making the correction of the computation of the equivalent magnetic dipole moment of the shim to compensate for an aspect ratio for the shape of the shim includes performing a computation of the internal magnetization of the shim using a BH-curve of the material to determine whether or not the shim is in saturation.

14. The method of claim 10 in which said making the another correction of the corrected computation of the equivalent magnetic dipole moment of the shim to compensate for the magnetic mirror effect in the pole-face of the magnet includes performing a correction for the distance to each field point in the imaging volume as a function of shim mass and location.

* * * * *